(12) United States Patent
Thiara et al.

(10) Patent No.: US 9,319,042 B2
(45) Date of Patent: Apr. 19, 2016

(54) SENSOR WITH CONCURRENT AUTOSENSING OF OUTPUT MODE AND MANUAL SELECTION

(75) Inventors: Jagjit S. Thiara, Southborough, MA (US); Manfred Wiezel, Schoenenberg (DE); Brian Haley Schriver, Woburn, MA (US)

(73) Assignees: Rockwell Technologies, Inc., Mayfield Heights, OH (US); Sensopart Industriesensorik GmbH (DE)

( * ) Notice: Subject to any disclaimer, the term of this patent is extended or adjusted under 35 U.S.C. 154(b) by 1067 days.

(21) Appl. No.: 13/423,669

(22) Filed: Mar. 19, 2012

(65) Prior Publication Data

US 2013/0015851 A1 Jan. 17, 2013

Related U.S. Application Data

(60) Provisional application No. 61/506,435, filed on Jul. 11, 2011.

(30) Foreign Application Priority Data

Feb. 9, 2012 (EP) ...................................... 12154590

(51) Int. Cl.
| | | |
|---|---|---|
| G01R 29/00 | (2006.01) | |
| H03K 17/082 | (2006.01) | |
| H03K 17/66 | (2006.01) | |
| G01R 33/02 | (2006.01) | |
| G01R 33/07 | (2006.01) | |
| G01R 33/09 | (2006.01) | |
| G01R 15/20 | (2006.01) | |

(Continued)

(52) U.S. Cl.
CPC .......... *H03K 17/0822* (2013.01); *H03K 17/667* (2013.01); *G01R 15/207* (2013.01); *G01R 19/0092* (2013.01); *G01R 27/28* (2013.01); *G01R 33/02* (2013.01); *G01R 33/07* (2013.01); *G01R 33/09* (2013.01)

(58) Field of Classification Search
CPC .. G01R 29/00; G01R 19/0092; G01R 15/207; G01R 33/02; G01R 33/07; G01R 33/09
USPC ......................................................... 324/244
See application file for complete search history.

(56) References Cited

U.S. PATENT DOCUMENTS 4,050,013 A * 9/1977 Maddox ......................... 324/234
4,918,824 A * 4/1990 Farrar ............................. 33/361

(Continued)

FOREIGN PATENT DOCUMENTS

| DE | 3905163 | 8/1990 | |
| DE | 3905163 A1 * | 8/1990 | ............. G01R 19/00 |

OTHER PUBLICATIONS

Translation of DE3905163.*

*Primary Examiner* — Jermele M Hollington
*Assistant Examiner* — Christopher McAndrew
(74) *Attorney, Agent, or Firm* — Boyle Fredrickson, S.C.

(57) ABSTRACT

A switching sensor may automatically configure itself to a sinking or a sourcing mode by monitoring the voltage of its switched output to determine a loading configuration associated with each of these operating modes. The auto detection may occur not only at start up but also during operation of the sensor by monitoring the output voltage or current in coordination with knowledge about the intended state of the output by the sensor. A manual selection of the operating mode and override of the autodetect feature may be provided for cases when multiple sensors are connected in parallel.

14 Claims, 4 Drawing Sheets

(51) Int. Cl.
  *G01R 19/00* (2006.01)
  *G01R 27/28* (2006.01)

(56) References Cited

U.S. PATENT DOCUMENTS

| | | | |
|---|---|---|---|
| 5,642,045 A * | 6/1997 | Keefe et al. | 324/244 |
| 5,757,184 A * | 5/1998 | Kurihara et al. | 324/244 |
| 7,521,927 B2 * | 4/2009 | Ku et al. | 324/244 |
| 8,610,428 B2 * | 12/2013 | Viala et al. | 324/244 |
| 8,749,231 B2 * | 6/2014 | Taylor et al. | 324/244 |
| 2008/0303518 A1 * | 12/2008 | Heyden et al. | 324/244 |
| 2009/0224754 A1 * | 9/2009 | Lamarre et al. | 324/251 |
| 2009/0230953 A1 * | 9/2009 | Lee | 324/244 |
| 2010/0271018 A1 * | 10/2010 | Clinton | 324/252 |
| 2010/0321013 A1 * | 12/2010 | Shimizu | 324/244 |

* cited by examiner

Prior Art

SENSOR WITH CONCURRENT AUTOSENSING OF OUTPUT MODE AND MANUAL SELECTION

CROSS REFERENCE TO RELATED APPLICATION

This application claims the benefit of U.S. provisional application 61/506,435 filed Jul. 11, 2011 and hereby incorporated by reference.

BACKGROUND OF THE INVENTION

The present invention relates to industrial sensors and, in particular, to an output circuit for such sensors allowing both current sinking and sourcing load connections.

Electronic sensors may be used to provide input signals, for example, to an industrial controller or the like, such signals allowing the controller to respond to the state of a controlled machine or process, via a stored control program, and to generate outputs to actuators affecting the operation of the machine or process.

One class of industrial sensors provides a switched output that may indicate one of two sensing states, for example, providing a binary "on" or "off" signal to the attached control system. Such switched sensors commonly provide an electrical interface having positive and negative leads through which the sensor may receive power and an output lead through which the sensor indicates its state. The signal on the output lead may adopt one of two interface standards. In a first standard, the output lead during an active state provides a positive voltage with respect to ground permitting an outflow of current to a ground-referenced load. Such sensors have a "current sourcing" interface. In the second standard, the output lead during an active state provides a ground voltage with respect to the positive lead permitting an inflow of current from a positive voltage referenced load. Such sensors have a "current sinking" interface.

In common switched sensor designs, the output of a "sourcing" sensor may be realized with a PNP transistor having its emitter attached to a source of positive voltage and its collector attached to the output lead of the sensor. In contrast, the output of the "sinking" sensor may be realized with an NPN transistor having its emitter attached to ground and its collector attached to the output lead of the sensor.

Both sensor types provide the same data but are fundamentally incompatible with respect to their interface with attached devices. This may require a manufacturer or user to stock multiple models leading to high costs and possible downtime if insufficient stock of the correct type is not available.

It is known to produce a switched sensor having an output that may emulate either a "sinking" or "sourcing" output by providing both transistors in a "push pull" arrangement and activating only the transistor required for the particular interface. The selection of this transistor may be made automatically by measuring the voltage on the output lead of the sensor prior to activation of either transistor. If the sensor is being used by a device that expects a sinking sensor, there will typically be a load connected between the output of the sensor and a positive voltage providing a positive voltage on the sensor output. This positive voltage may be read by a microprocessor while the sensor is being initialized and used to select the sinking mode of operation in which the sensed parameter will activate only the NPN transistor. Conversely if the sensor is being used by a device that expects a sourcing sensor, there will typically be a load connected between the output of the sensor and ground providing a ground voltage on the output of the sensor. This ground voltage may be read by the microprocessor during initialization of the sensor and used to select a sourcing mode of operation and activation of the PNP transistor with changes in sensor state.

SUMMARY OF THE INVENTION

In some important switched sensor applications, the load may not be connected to the sensor output (or connected to power or ground) at the time that the sensor is initialized, defeating the autodetection process during sensor initialization. Nevertheless, the present inventors have recognized that it is possible continue autodetection concurrently with operation of the sensor by analyzing the voltage of the sensor output against the known sensor state during operation of the sensor. Unexpected voltages on the sensor output can indicate a different output mode should be adopted and the output may be switched accordingly. The present inventors have also recognized that in some cases where sensors are connected in parallel, autodetection systems may produce an erroneous result. For this reason, in one embodiment of the invention, a manual selection is added to the autodetection process.

Specifically, the present invention provides an electrical sensor having a switched electrical output and including a sensor element sensing a physical condition to produce a sensor signal and a threshold circuit receiving the sensor signal to produce a switched signal based on the sensor signal. A first solid-state switching device is connected between a source of power and a sensor output to source current to the sensor output when the first solid-state switching device is activated, and a second solid-state switching device is connected between ground and the sensor output sink current to the output when the second solid-state switching device is activated. An autodetection circuit routes the switched signal to one of the first solid-state switching device second solid-state switching device, and concurrent with that routing, monitoring the sensor output to deduce the presence of one of a load connected between the sensor output and a source of power and a load connected between the sensor output and ground to determine the one of the first solid-state switching device and second solid-state switching device to which the switched signal is routed.

It is thus a feature of at least one embodiment of the invention to permit autodetection of sinking or sourcing mode in situations where the loads are not clearly established at the time of initialization of the sensor either because they are not connected to the sensor, do not have power applied, or employ a switched power connection.

The autodetection circuit may route the switched signal to the first solid-state switching device in a sourcing mode and to the second solid-state switching device in a sinking mode and the autodetection circuit may change its mode from sourcing mode to sinking mode when the sensor output has a high-voltage when the first solid-state switching device is off and wherein the autodetection circuit changes its mode from sinking mode to sourcing mode when the sensor output has a low voltage when the second solid-state switching device is off.

It is thus a feature of at least one embodiment of the invention to permit autodetection without interference by the actual sensor output.

The first solid-state switching device may be a PNP transistor having an emitter connected to the source of power and the collector connected to the sensor output and the second solid-state switching device may be an NPN transistor having a collector connected to the sensor output and an emitter connected to ground.

It is thus a feature of at least one embodiment of the invention to provide a system working with common push-pull output circuit designs.

The autodetection circuit may include a threshold detector comparing the sensor output voltage to a voltage less than a voltage of the power source and greater than a voltage of the ground.

It is thus a feature of at least one embodiment of the invention to provide a simple binary signal that can be used for simple mode autodetection.

The autodetection circuit may include a microprocessor executing a stored program to monitor the sensor output voltage.

It is thus a feature of at least one embodiment of the invention to permit sophisticated autodetection algorithms.

The autodetection circuit may further include a selection input causing a predetermined routing of the switched signal to one of the first solid-state switching device and second solid-state switching device without regard to voltage of the sensor output.

It is thus a feature of at least one embodiment of the invention to permit the invention to work in situations where multiple sensors are connected in parallel.

The autodetection circuit may alternatively or in addition change its mode from sourcing mode to sinking mode when the sensor output is not sourcing current when the first solid-state switching device is on and wherein the autodetection circuit changes its mode from sinking mode to sourcing mode when the sensor output is not sinking current when the second solid-state switching device is on.

It is thus a feature of at least one embodiment of the invention to permit auto mode detection not only when the output transistors are off but also when the output transistors are on.

The sinking and sourcing of current from the sensor output may be deduced from a voltage of the sensor output dropped by current flow through a transistor.

It is thus a feature of at least one embodiment of the invention to allow current flow to be deduced by a simple monitoring of sensor output voltage.

These particular features and advantages may apply to only some embodiments falling within the claims and thus do not define the scope of the invention.

DETAILED DESCRIPTION OF THE PREFERRED EMBODIMENT

Background on Switching Sensors

Figure 1:
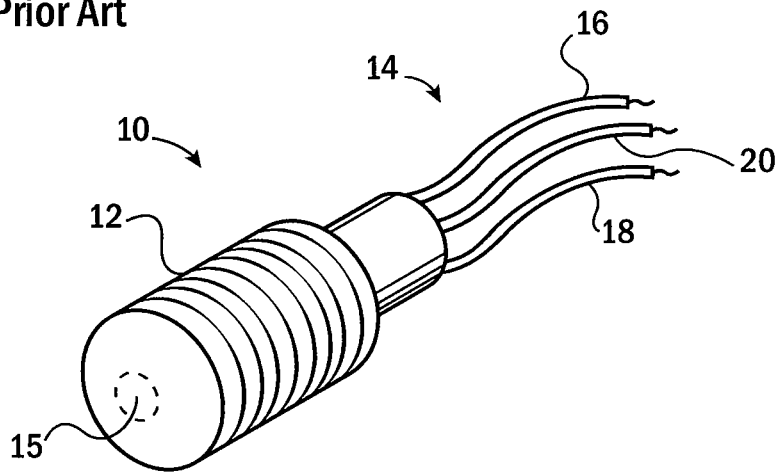
FIG. 1 is a perspective representation of a prior art three-wire sensor providing power and ground lines and an output line.

Referring now to FIG. 1, a standard commercially available sensor 10 may provide a sensor body 12 holding a sensor element 15. The sensor element 15 may be any of a variety of different element types known in the art including: an optical sensor, a reluctance sensor, temperature sensor, a pressure sensor, a capacitive sensor, an inductive sensor, an ultrasonic sensor, a Hall effect sensor, an eddy current sensor or the like.

The sensors 10 may further provide for three conductive leads 14 including: a power lead 16, a ground lead 18, and an output lead 20. Generally, the sensor 10 receives power for operation through power lead 16 as referenced to ground lead 18, and provide a two-state or binary signal indicating the sensor state through output lead 20.

Figure 2:
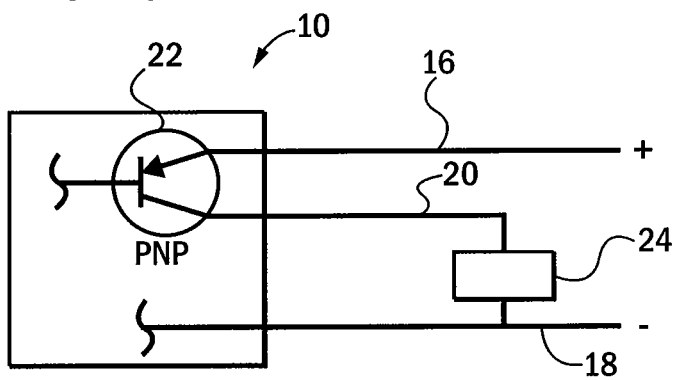
FIG. 2 is a schematic representation of an output circuit for the sensor of FIG. 1 providing a sourcing configuration to a load connected to ground.
Figure 3:
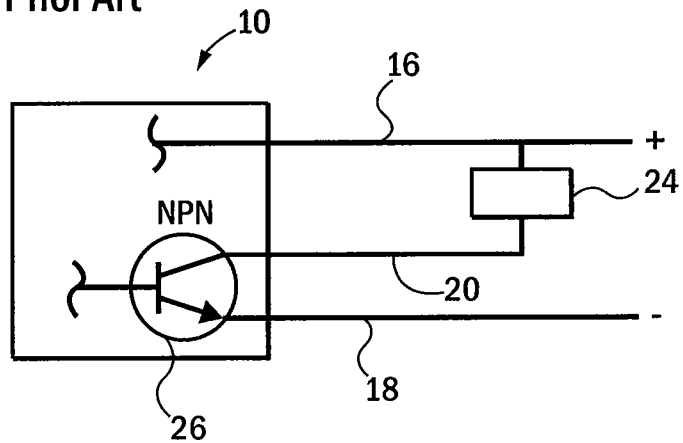
FIG. 3 is a figure similar to that of FIG. 2 showing a sinking configuration to a load connected to a positive voltage.

Referring now to FIGS. 2 and 3, the two state or binary signal provided through output lead 20 is conventionally produced by completing or breaking a conductive path from the output lead 20 to either the power lead 16 or the ground lead 18. In the former case, shown in FIG. 2, the sensor 10 provides for a "current sourcing" interface normally implemented by a PNP transistor 22 having an emitter connected to power lead 16 and its collector connected to output lead 20 to source or output current from the output lead 20 to a load 24, the latter connected to ground. When the PNP transistor 22 is activated, current is sourced from output lead 20 through the load 24 to ground lead 18. The load 24 represents the electrical equivalent of the input circuitry to which the sensor 10 is connected (for example, an input module to a programmable logic controller) and may be of a resistance to ground of the value equal to the input impedance of the connected device.

FIG. 3 shows the case in which a "current sinking" interface is provided by the sensor 10. Such an interface is normally implemented by an NPN transistor 26 having its emitter connected to the ground lead 18 and its collector connected to the output lead 20. In this case the load 24 is connected between power lead 16 and the output lead 20 so that when the transistor 26 is activated, current is input into the sensor 10 through the load 24.

Switching Sensor Hardware

Figure 4:
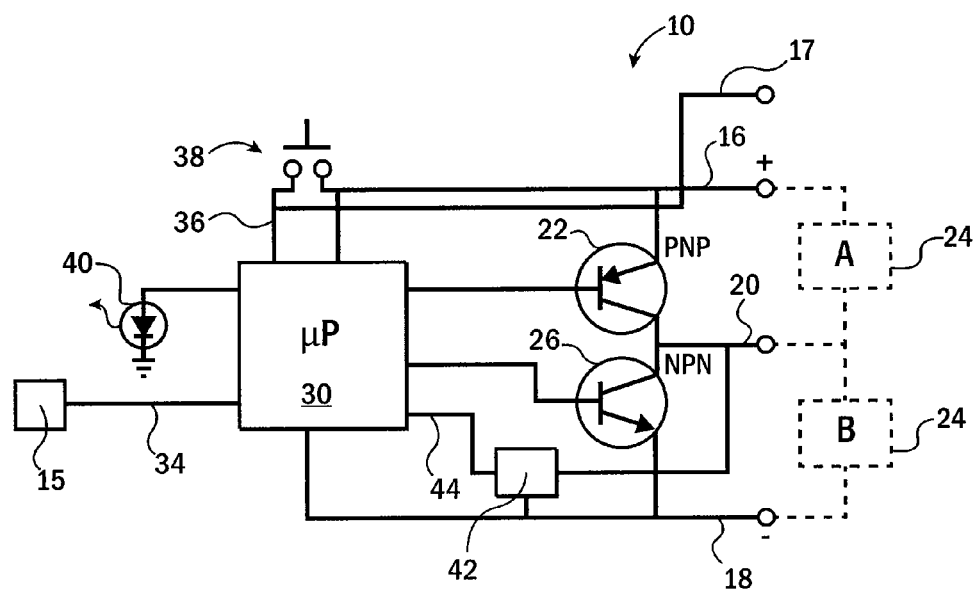
FIG. 4 is a block diagram of the present invention providing output monitoring circuit to deduce whether a sinking or sourcing configuration should be adopted as controlled by a microprocessor and further showing a teaching input to the microprocessor to override the autodetection process and manually select the operating mode.

Referring now to FIG. 4, in the present invention, both a PNP transistor 22 and an NPN transistor 26 are provided, the PNP transistor having its emitter connected the power lead 16 and its collector connected to output lead 20 and the NPN transistor having its collector connected to the output lead 20 and its emitter connected to ground lead 18.

In operation of the sensor 10, only one of transistors 22 and 26 will be used depending on the mode of the sensor 10 as either "current sourcing" or "current sinking" as described above. The bases of transistors 22 and 26 are connected to separate digital outputs of a microprocessor 30, which may activate PNP transistor 22 by a low voltage (e.g. 0 V) output causing PNP transistor 22 to conduct current between the emitter and the collector and deactivate PNP transistor 22 by a high state output (e.g. 24 V) causing PNP transistor 22 to cease conduction from the emitter to the collector. Likewise, a high state output from the microprocessor 30 to the base of NPN transistor 26 will cause conduction of current between the collector and the emitter of the NPN transistor 26, and a low state output to NPN transistor 26 will stop conduction from the collector to the emitter.

Generally, the active transistor 22 or 26 will be turned on and off as a function of the state of the signal received via sensor element 15. The sensor element 15 may be any of the well-known types of sensor elements described above and may communicate a sensor signal 34 to an analog input of the microprocessor 30 which may convert the sensor signal 34 into a binary value by the application of a threshold according to techniques well known in the art. The threshold may be fixed or may depend on a transition direction of the sensor signal 34 to provide for switching hysteresis, for example, in a Schmitt trigger operation. The binary value indicates a state of the sensor 10 as activated or not-activated.

The microprocessor 30 may also receive power derived from the power lead 16 and be connected to the ground lead 18 provide power to the microprocessor. A teaching input 36 may be provided to one or more digital inputs to the microprocessor 30 from corresponding pushbutton 38. Additionally, the microprocessor 30 may provide one or more output signals to one or more corresponding indicator LEDs 40 as will be discussed. In addition or alternatively, the teaching input 36 may be connected to the lead 17 that can be connected along with lead 16, 20 and 18 to an industrial controller (not shown) for remote operation of the teaching input 36 under the control of a control program executing on the industrial controller or for attachment to a remote switch.

It will be appreciated that additional circuitry including voltage level adjusters, buffer circuitry and voltage protection circuitry may be used to provide an interface between the microprocessor and its various input and output voltages, as are omitted herein for clarity but which will be understood to those of ordinary skill in the art.

The microprocessor 30 may also communicate with a threshold circuit 42 monitoring the voltage at the output lead 20 with respect to ground lead 18 to provide a mode signal 44 to the microprocessor 30 used to determine whether the PNP transistor 22 or NPN transistor 26 should be active for controlling the voltage of the output lead 20.

Figure 5:
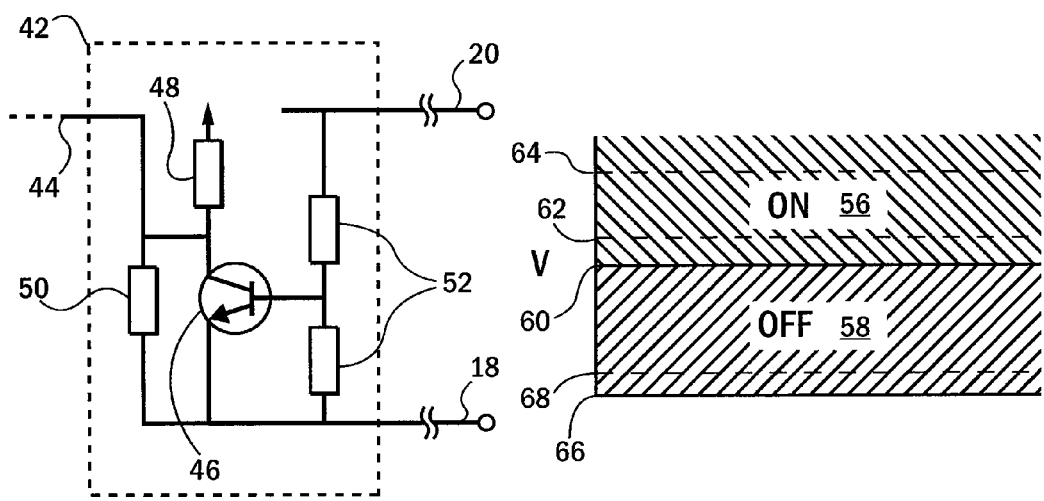
FIG. 5 is a schematic representation of the output monitoring circuit and a graph showing the interpretation of various voltage levels in at least one embodiment of the invention.

Referring now momentarily to FIG. 5, the threshold circuit 42 in one embodiment provides for a voltage comparator and in a second embodiment provides for a range adjuster, either of which may be implemented, in one example, with a NPN transistor 46 having its emitter connected to ground and its collector connected to a pull-up resistor 48 (having its other terminal connected to a source of positive voltage) and a pulldown resistor 50 (having its other terminal connected to ground) so that a junction of the resistors 48 and 50 has a high-voltage when transistor 46 is turned off and a low voltage when transistor 46 is turned on. This junction provides an autodetection input 44 connected to the microprocessor 30 and the resistors 48 and 50 are adjusted to provide proper input voltage range for the microprocessor 30.

The base of the transistor 46 is connected to the junction between two resistors 52 forming a voltage divider connected between output lead 20 and ground lead 18. In a first embodiment, the voltage divider of resistors 52 provides a switching of transistor 46 between an on state 56 and an off-state 58 at a threshold voltage 60 slightly below the voltage of the power lead 16. Referring momentarily also to FIG. 4, accordingly, the transistor 46 will provide an "on state" 56 when load 24 is connected at position A between the output lead 20 and the power lead 16 (at voltage 62, typically 24 V) or to a higher external voltage 64. Conversely, the off-state 58 will be produced when the output lead 20 is at ground voltage 66 or at a voltage 68 slightly above ground voltage 66 by a saturation voltage of transistor 26, for example. This configuration provides a switched or binary input to the microprocessor 30

In an alternative embodiment, the voltage divider of resistors 52 may simply provide a level shifting mapping of the voltage range between ground voltage 66 and higher external voltage 64 to a voltage range of a corresponding analog input range to the microprocessor 30. This configuration provides an analog voltage to the microprocessor 30 which may be analyzed by an internal A/D converter.

Autodetection at Power Up

Figure 8:
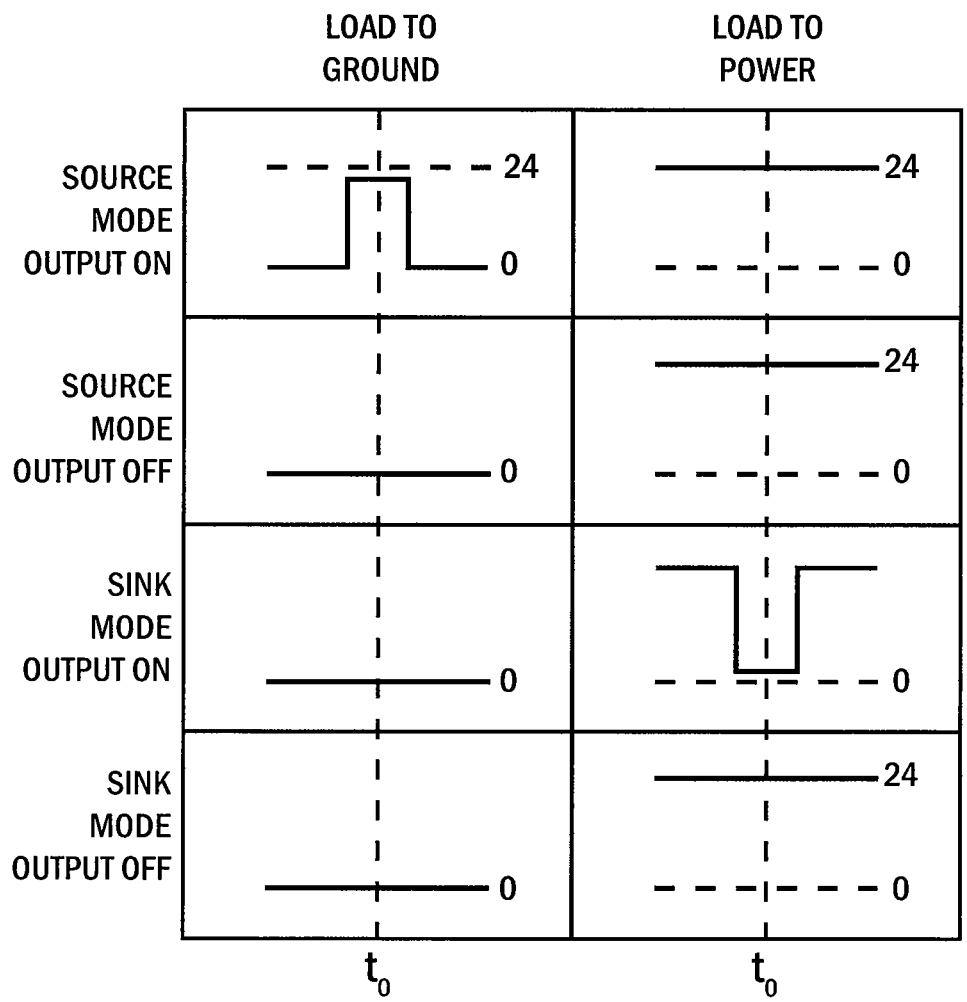
FIG. 8 is a diagram of an output drive signal to a PNP or NPN transistor showing interpretation of output voltages per the present invention in one embodiment

Referring to FIGS. 4, 5 and 8, when power is first applied to the sensor 10, transistors 22 and 26 are both turned off and the voltage at the output lead 20 may be monitored. If that voltage is below the threshold voltage 60, the microprocessor operates under an assumption that a load is connected in position B for intended current sourcing operation and the microprocessor 30 drives only PNP transistor 22 (according to the state of the sensor signal 34 received from the sensor element 15) leaving transistor 26 off. Conversely if the voltage of output lead 20 is above the threshold voltage 60 when both transistors 22 and 26 are turned off at power up, the microprocessor 30 operates under an assumption that the load 24 is connected in position A for current sinking operation and PNP transistor 22 is turned off while transistor NPN transistor 26 is turned on and off in accordance with the sensor signal 34 from sensor element 15.

Autodetection after Power Up

It is possible that at the time of power up of the microprocessor 30 that the load 24 has not been connected to the output lead 20 or is connected to the output lead 20 and also to an external voltage that is switched off at the time of power up (effectively disconnecting the load 24). In order to address this possibility, the present invention may continue the autodetection process even after start up. Yet after startup, the voltage of output lead 20 is a function both of the connection of the load 24 (in either position A or B) and also of the state of operation of transistors 22 and 26. Nevertheless, the microprocessor 30 may deduce the connection of the load in position A or B during this time by observing both the voltage on the output lead 20 and the current state of the transistors 22 and 26.

Referring to FIG. 8, in the process of deducing the connection of the load 24 after start up, the program of the microprocessor 30 may evaluate up to eight distinct combinations of transistor states and output voltages on output lead 20. Four of the combinations are associated with a load 24 that is connected to ground lead 18 (position B and current sourcing mode) shown in a left column of the table of FIG. 8, and four of the combinations are associated with a load connected to the power lead 16 (position A and sinking mode). Output voltages that are inconsistent with the current operating mode indicate that the operational mode of the sensor 10 (e.g. sinking and sourcing) should be changed.

Referring also to FIG. 4, consider first the situation where the sensor 10 is operating in the current sourcing mode to output current through output lead 20 via PNP transistor 22. If the load 24 is connected to ground (position B) as assumed, turning on of PNP transistor 22 at a time $t_0$ will result in a rise of voltage of the output lead 20 to approximately the voltage of the power lead 16 (i.e. 24 volts) minus a saturation voltage of the PNP transistor 22 and the turning off of PNP transistor 22 will result in a voltage of the output lead of zero as the load 24 pulls the voltage to ground. If however, the load 24 is in fact connected to the power lead 16 when PNP transistor 22 is turned on, the voltage of the output lead 20 at time $t_0$ will be equal to the voltage of 24 V of the power lead 16 and the voltage will stay the same when PNP transistor 22 is turned off. Accordingly, the program executing on the microprocessor 30 may deduce, after one state change of the sensor element 15, an incorrect assumptions that the operating mode should be "current sourcing" and may change the operating mode to "current sinking".

Conversely, consider the case where the sensor 10 is operating in the current sinking mode to receive current through output lead 20 through NPN transistor 26 which is switched while PNP transistor 22 remains off. If the load 24 is connected to power (position A) as assumed, when NPN transistor 26 is turned on at time $t_0$, the voltage at the output lead 20 will drop to near ground (above ground by the saturation voltage of NPN transistor 26) and when transistor 26 is turned off the voltage will rise to the voltage of the power lead 16 typically 24 V. On the other hand, if the load 24 is in fact connected to ground (position B) when NPN transistor 26 is turned on or off the voltage of the output lead 20 will be 0 V. Thus, an error in configuration can again be detected after one switching cycle of the sensor element 15 and the mode of the microprocessor 30 changed accordingly.

The above detection process requires one state change of the sensor 10 from on to off. In an alternative embodiment, misconfiguration of the mode of sensor 10 (e.g. current sourcing or sinking) may be detected without waiting for a switching of the sensor signal 34, by analyzing the minor voltage offsets from the ground lead 18 or from the power lead 16 such as indicated by current flow through the transistors 22 or 26. This minor voltage offset may be provided by the saturation voltage drop of transistors 22 and 26 or by other intervening resistance values. Thus, when the sensor 10 is operating in the current sourcing mode with the PNP transistor 22 on, an output value at output lead 20 equal to the voltage of power lead 16 (24 V) that is not decreased by the saturation voltage of PNP transistor 22 will indicate a misconfiguration of the sensor mode.

A similar analysis may be performed when the sensor 10 is operating in the current sinking mode. When the sensor 10 is operating in the current sinking mode with transistor 26 turned on, a voltage of the output lead 20 equal to ground, as opposed to being above ground by the saturation voltage of NPN transistor 26, will indicate that the sensor mode is misconfigured.

When transistors 22 and 26 are both turned off, a misconfiguration is of course quite apparent in the voltages as indicated by FIG. 8 without the need for state change or subtle voltage detection.

As noted above, this current sensing through the transistors 22 and 26 may alternatively be provided by a small series resistance in the current path or other current sensing techniques, for example, current passing through an optical isolator.

Figure 6:
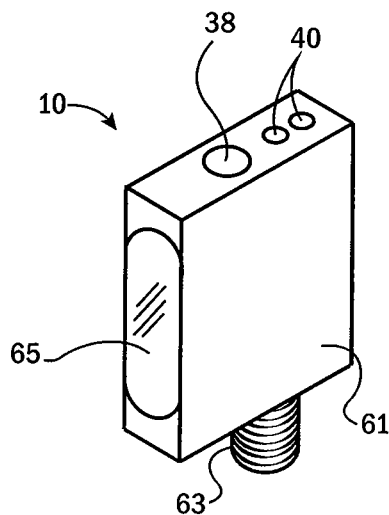
FIG. 6 is a perspective view of the sensor housing showing a pushbutton switch for providing a teaching input.

Referring now to FIG. 6, a sensor 10 of the present invention may include a generally rectangular housing 61 having a rear facing electrical connector 63 containing power lead 16, output lead 20 and ground lead 18 and possibly additional programming leads. A front surface of the housing 61 may include, for example, a window 65 permitting the receipt of light when the sensor 10 is an optical sensor. A top surface of the housing 61 may expose pushbutton 38 and indicator LEDs 40. Pushbutton 38 may be used to provide a teaching signal to the microprocessor 30 (shown in FIG. 4) that switches the microprocessor 30 between sinking and sourcing mode manually and disables autodetection. It will be appreciated that other interfaces having additional pushbuttons or switches 38 may also be used. Further, as noted above, the teaching signal to the microprocessor 30 may be received remotely through line 17 from an industrial controller or the like.

Figure 7:
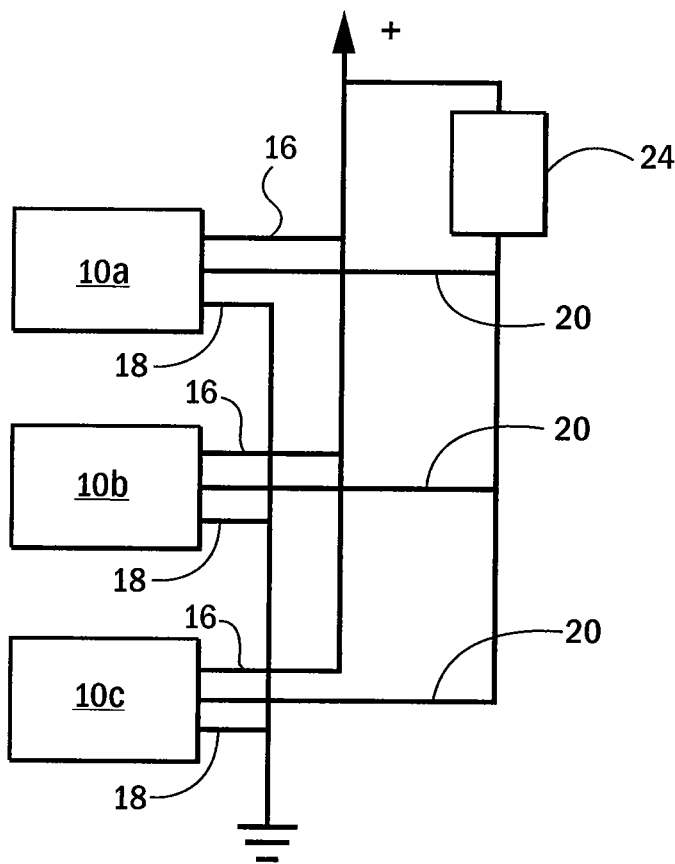
FIG. 7 is a schematic representation of multiple sensors connected in parallel such as may prevent autodetection and require a manual configuration selection.

Referring now to FIG. 7, this manual selection may be necessary where multiple sensors 10a-10c may be connected in parallel across a load 24 and the auto configuration technique is thus thwarted by one of the sensors 10a, for example, pulling the voltage of output lead 20 low when another sensor 10b is auto detecting the load 24 with both of its transistors 22 and 26 turned off. In this state, sensor 10b would erroneously conclude that the load 24 was connected between its output lead 20 and ground lead 18. By pushing pushbutton 38 until an LED 40 illuminates showing a particular operating mode (current sourcing or current sinking) autodetection may be deactivated and the correct mode indicated. It will be understood that a variety of different interfaces maybe employed for this purpose.

A second LED 40 may display the state of the sensor 10 as activated or not-activated, independent of the operating mode of the sensor as current sinking or current sourcing, reducing user confusion when the operating mode changes.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a controller" and "a processor" can be understood to include one or more controllers or processors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

The invention claimed is:

1. An electrical sensor providing a switched electrical output, the electrical sensor comprising:
   a sensor element sensing a physical condition to produce a sensor signal;
   a first solid-state switching device connected between a source of power and a sensor output to source current at the sensor output when the first solid-state switching device is activated;
   a second solid-state switching device connected between ground and the sensor output to sink current at the sensor output when the second solid-state switching device is activated;
   an autodetection circuit operable to:
      produce a switched signal based on the sensor signal,
      receive a mode signal having a first state and a second state, wherein the first state corresponds to the sensor output sourcing current and the second state corresponds to the sensor output sinking current,
      route the switched signal to the first solid-state switching device when the mode signal is in the first state and to the second solid-state switching device when the mode signal is in the second state,
      when the sensor element produces the sensor signal, monitor the sensor output to identify a presence of one of a sinking load connected between the sensor output and a source of power and a sourcing load connected between the sensor output and ground,
      when the presence of the sourcing load is identified as the sensor element produces the sensor signal, set the mode signal to the first state, and
      when the presence of the sinking load is identified as the sensor element produces the sensor signal, set the mode signal to the second state.

2. The electrical sensor of claim 1 wherein autodetection circuit changes its mode from sourcing mode to sinking mode when the sensor output has a high-voltage when the first solid-state switching device is off and wherein the autodetection circuit changes its mode from sinking mode to sourcing mode when the sensor output has a low voltage when the second solid-state switching device is off.

3. The electrical sensor of claim 1 wherein the first solid-state switching device is a PNP transistor having an emitter connected to the source of power and a collector connected to the sensor output and the second solid-state switching device is an NPN transistor having a collector connected to the sensor output and an emitter connected to wound.

4. The electrical sensor of claim 1 wherein the mode signal is generated by a threshold detector comparing the sensor output voltage to a voltage less than a voltage of the source of power and greater than a voltage of the ground.

5. The electrical sensor of claim 1 wherein the autodetection circuit includes a microprocessor executing a stored program to monitor the sensor output voltage.

6. The electrical sensor of claim 1 wherein the sensor element is selected from the group of sensor elements sensing physical conditions selected from the group consisting of: optical intensity, magnetic reluctance, temperature, pressure, and capacitance.

7. The electrical sensor of claim 1 wherein the sensor element is selected from the group of sensor elements sensing physical conditions selected from the group consisting of: inductance, ultrasonic intensity, magnetic field, and eddy current resistance.

8. The electrical sensor of claim 1 wherein the autodetection circuit further includes a selection input causing a predetermined routing of the switched signal to one of the first solid-state switching device and second solid-state switching device without regard to voltage of the sensor output.

9. The electrical sensor of claim 1 wherein the autodetection circuit changes its mode from sourcing mode to sinking mode when the sensor output is not sourcing current when the first solid-state switching device is on and wherein the autodetection circuit changes its mode from sinking mode to sourcing mode when the sensor output is not sinking current when the second solid-state switching device is on.

10. The electrical sensor of claim 9 wherein the sinking and sourcing of current from the sensor output is deduced from a voltage of the sensor output dropped by current flow through a transistor.

11. A method of automatically selecting an interface mode for an electrical sensor providing a switched electrical output, the method comprising the steps of:
   (a) sensing a physical condition to produce a switched signal based on the physical condition;
   (b) detecting a mode signal having a first state and a second state, wherein the first state corresponds to the sensor output sourcing current and the second state corresponds to the sensor output sinking current;
   (c) responsive to the mode signal, using the switched signal to control one of a first solid-state switching device connected between a source of power and a sensor output to source current at the sensor output, and a second solid-state switching device connected between ground and the sensor output to sink current at the sensor output when the second solid-state switching device is activated; and
   (d) changing the interface mode for the electrical sensor when sensing the physical condition and a voltage at the sensor output and a predetermined combination of the switched signal and the voltage at the sensor output indicate that a current interface mode is inconsistent with an attached load to the sensor output.

12. The method of claim 11 wherein the interface mode is changed when the switched signal is routed to the first solid-state switching device and the sensor output has a high-voltage when the first solid-state switching device is off and the interface mode is changed when the switched signal is routed to the second solid-state switching device and the sensor output has a low voltage when the second solid-state switching device is off.

13. The method of claim 11 wherein the interface mode is changed when the switched signal is routed to the first solid-state switching device and the sensor output is not sourcing current when the first solid-state switching device is on and the interface mode is changed when the switched signal is routed to the second solid-state switching device and the sensor output is not sinking current when the second solid-state switching device is on.

14. An electrical sensor providing a switched electrical output, the electrical sensor comprising:
   a sensor element sensing a physical condition to produce a sensor signal;
   a first solid-state switching device connected between a source of power and a sensor output to source current at a sensor output when the first solid-state switching device is activated;

a second solid-state switching device connected between ground and the sensor output to sink current at the sensor output when the second solid-state switching device is activated;

a threshold circuit operable to detect a voltage at the sensor output and to activate one of the first solid state switching device and the second solid state switching device responsive to the voltage detected at the sensor output and responsive to the sensor signal; and a selection input causing a predetermined activation of one of the first solid-state switching device and second solid-state switching device without regard to the voltage of the sensor output.

* * * * *